United States Patent
Sung et al.

(10) Patent No.: US 7,589,990 B2
(45) Date of Patent: Sep. 15, 2009

(54) SEMICONDUCTOR ROM DEVICE AND MANUFACTURING METHOD THEREOF

(75) Inventors: Chih-Ta Star Sung, Glonn (DE); Thomas Chang, Hsinchu (TW); Ing-Ruey Liaw, Hsinchu (TW)

(73) Assignee: Taiwan Imagingtek Corporation, Jhudong (TW)

( * ) Notice: Subject to any disclaimer, the term of this patent is extended or adjusted under 35 U.S.C. 154(b) by 0 days.

(21) Appl. No.: 11/002,204

(22) Filed: Dec. 3, 2004

(65) Prior Publication Data

US 2006/0120133 A1    Jun. 8, 2006

(51) Int. Cl.
*G11C 17/00*    (2006.01)
*G11C 5/06*    (2006.01)
*G11C 7/00*    (2006.01)

(52) U.S. Cl. .................. 365/104; 365/72; 365/103; 365/189.15

(58) Field of Classification Search .................. 257/350, 257/392, 500; 365/94, 103, 104; 716/5
See application file for complete search history.

(56) References Cited

U.S. PATENT DOCUMENTS

| | | | | |
|---|---|---|---|---|
| 4,394,748 A * | 7/1983 | Campbell, Jr. | ............ | 365/104 |
| 4,488,065 A * | 12/1984 | Doty, II | ............ | 327/75 |
| 4,586,163 A * | 4/1986 | Koike | ............ | 365/104 |
| 4,587,477 A * | 5/1986 | Hornak et al. | ............ | 323/312 |
| 5,017,919 A * | 5/1991 | Hull et al. | ............ | 341/136 |
| 5,331,295 A * | 7/1994 | Jelinek et al. | ............ | 331/57 |
| 5,351,212 A * | 9/1994 | Hashimoto | ............ | 365/185.21 |
| 5,572,462 A * | 11/1996 | Lee | ............ | 365/168 |
| 5,644,312 A * | 7/1997 | Deevy et al. | ............ | 341/160 |
| 5,689,432 A * | 11/1997 | Blaauw et al. | ............ | 716/18 |
| 6,549,666 B1 * | 4/2003 | Schwartz | ............ | 382/233 |
| 6,643,828 B2 * | 11/2003 | Naffziger et al. | ............ | 716/2 |
| 7,084,464 B2 * | 8/2006 | Zounes | ............ | 257/368 |
| 2002/0060939 A1 * | 5/2002 | Kuo et al. | ............ | 365/207 |
| 2004/0032293 A1 * | 2/2004 | Maigret et al. | ............ | 327/540 |
| 2005/0201148 A1 * | 9/2005 | Chen et al. | ............ | 365/185.03 |
| 2005/0270860 A1 * | 12/2005 | Chevallier | ............ | 365/189.05 |
| 2006/0008983 A1 * | 1/2006 | Yeh | ............ | 438/257 |

* cited by examiner

*Primary Examiner*—Ly D Pham

(57) ABSTRACT

The present invention provides a new semiconductor Read-Only Memory, ROM, which stores more than one bit per cell. The potential of multiple threshold voltages combined with the potential multiple ratios of device channel width and length makes an ROM cell store multiple bits feasible. An N-type or a P-type MOS device of the standard CMOS process or a flat-cell mask ROM process are operable devices and processes in the design of this multi layer cell ROM. The ROM cell with smaller size is implemented to represent the LSB bits, while the larger size ROM cell is to represent the MSB bits.

5 Claims, 10 Drawing Sheets

$Ids = K(W/L)(Vgs-Vt)^2$

|  | W | SA1 | SA2 | SA3 | D1 | D21 |
|---|---|---|---|---|---|---|
| VBL<VR1 | W4 | 1 | 1 | 1 | 1 | 1 |
| VR1<VBL<VR2 | W3 | 0 | 1 | 1 | 0 | 1 |
| VR2<VBL<VR3 | W2 | 0 | 0 | 1 | 1 | 0 |
| VBL<VR3 | W1 | 0 | 0 | 0 | 0 | 0 |

|  | Vt | SA1 | SA2 | SA3 | D1 | D2 |
|---|---|---|---|---|---|---|
| VBL<VR1 | Vt1 | 1 | 1 | 1 | 1 | 1 |
| VR1<VBL<VR2 | Vt2 | 0 | 1 | 1 | 0 | 1 |
| VR2<VBL<VR3 | Vt3 | 0 | 0 | 1 | 1 | 0 |
| VBL<VR3 | Vt4 | 0 | 0 | 0 | 0 | 0 |

| Bit Line Voltage | W | Vt | D1 | D2 | D3 | D4 |
|---|---|---|---|---|---|---|
| VBL1 | W4 | Vt1 | 0 | 0 | 0 | 0 |
| VBL2 | W3 | Vt1 | 0 | 0 | 0 | 1 |
| VBL3 | W2 | Vt1 | 0 | 1 | 1 | 0 |
| VBL4 | W1 | Vt1 | 0 | 0 | 1 | 1 |
| ... |  |  |  |  |  |  |
| VBL16 | W1 | Vt4 | 1 | 1 | 1 | 1 |

Width 55
Length 56
Diffusion 57 (4 Vt Masks)

4 MSB bits + 4 LSB bits
= 1 Byte (8 bits)
Area_C1 > Area_C2

SEMICONDUCTOR ROM DEVICE AND MANUFACTURING METHOD THEREOF

BACKGROUND OF THE INVENTION

1. Field of Invention

This invention relates generally to a semiconductor ROM, the Read-Only Memory. In particular, it relates to a ROM cell and its related sensing scheme for reading which can store multiple bits.

2. Description of Related Art

A semiconductor memory is typically comprised of an array of memory cells which are aligned in rows and columns as shown in FIG. 1. A memory cell 11 is used to store data for future use. For area efficiency, a memory array includes a large amount of memory cells 12. A word line, WL runs across top of hundreds or even thousands of memory cell gates which makes the WL capacitance load quite large and needs a big driver 7 to accelerating the speed of charging up the capacitive load of memory cells hooked to the same word line.

The Read Only Memory, ROM has advantages of small cell size and fully compatible standard CMOS logic process and therefore costs least price to manufacture compared to its counter parts other memories like SRAM, DRAM or some Non-Volatile Memories, NVM including flash or EPROM memories. A prior art ROM cell as shown in FIG. 1 is commonly comprised of an N-type device 1 with a fixed channel width and length. The gate of the ROM device is hooked to a world line 2 while another node of diffusion, so named as "drain" is hooked into a so named "bit line" 3 and the other node of diffusion is grounded to the return of power supply which in most likely grounded to "0V" in a standard CMOS process. In the mask design or layout of the ROM cell as shown in top right of FIG. 1, a contact 4 is used to connect drain of diffusion node to a bit line, a poly running across top of the thin oxide layer forms the gate of an ROM cell which is connected to the word line. For reliability of cell size, there will be minimum spacing between the contact and the edge 5 of diffusion area and the spacing between an edge of diffusion to the poly 6. Most ROM cell in CMOS process use a minimum channel length of NMOS device. The spacing between the contact and the edge of diffusion plus the shape of contact determines the area of an ROM cell. The prior art of an ROM cell with minimum size has empty area as shown in FIG. 1 layout diagram.

The prior art of the ROM design mainly is comprised of cell with a fixed channel width and length and a fixed threshold voltage. This limits the density of representing one bit for each ROM cell.

SUMMARY OF THE INVENTION

The present invention of an MLC ROM, Multi-Layer Cell Read Only Memory and its sensing scheme significantly increases the data density per cell with a reliable reading mechanism.

The present invention of an MLC ROM stores more than 1 bit per cell by applying multiple levels of geography, said the device channel length or width to draw different levels of sinking current through the selected cell.

According to an embodiment of this invention of the MLC ROM, the ROM cell is comprised of an N-type MOS device in density of 2 bits per cell or below, while it is comprised of a P-type MOS device when pursuing a higher density said 3 bits per cell or beyond.

According to an embodiment of this invention of the MLC ROM, at least two banks of memory arrays share a circuit composing of one column of memory cells generating a referencing voltage.

According to an embodiment of this invention of the MLC ROM, a contact-less "flat-cell" ROM cell with smaller cell area is included.

According to an embodiment of this invention of the MLC ROM, multiple threshold voltage of ROM cell is used to differentiate potential multiple level of current sinking speed of a selected ROM cell.

The present invention of the MLC ROM, a larger cell is implemented to represent the MSB bits, the Most Significant Bits, while a smaller cell is used to represent the LSB Bits, the least Significant Bits.

According to another embodiment of this invention of the MLC ROM, for gaining higher reliability and hence the yield, a multiple steps of sensing scheme is applied to increase the margin of the differential voltage between bit line of the selected cell and the referencing cell.

According to another embodiment of this invention of the MLC ROM, for achieving high speed and high accuracy in the 4 bits per cell design, a current-to-voltage converter is applied to convert the Ids level to a stable voltage output which is connected to two comparators in series for a two steps sensing and to generate the 4 bits of out put logic states.

According to another embodiment of this invention of the MLC ROM, a self-timer circuit is implemented to pull down the word line voltage to stop further pulling done the bit line voltage when a stable output voltage from a sense amplifier is obtained.

According to an embodiment of this invention of the MLC ROM, the ROM cell is composed of an N-type device of the CMOS process.

According to an embodiment of this invention of the MLC ROM, the ROM cell is composed of the contact-less "Flat N-type cell".

Other aspects and advantages of the present invention will become apparent from the following detailed description, taken in conjunction with the accompanying drawings, illustrating by way of example the principles of the invention. It is to be understood that both the foregoing general description and the following detailed description are by examples, and are intended to provide further explanation of the invention as claimed.

DESCRIPTION OF THE PREFERRED EMBODIMENTS

Figure 1:
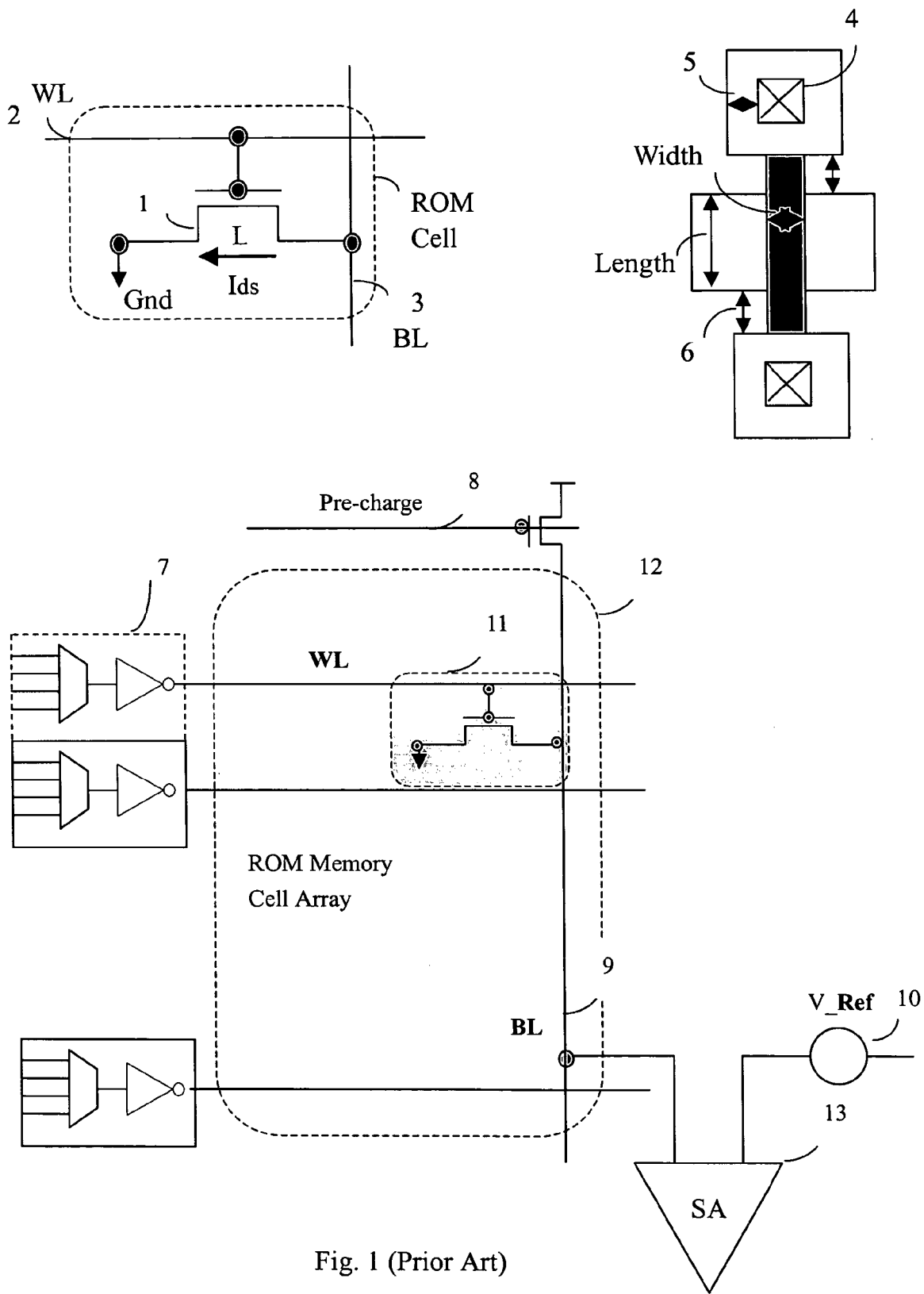
FIG. 1 depicts the prior art ROM cell symbolic, ROM cell layout and a simplified block diagram of a memory bank comprising a word line decoder, a word line driver, array of ROM cells, a sense amplifier and a column decoder.

The semiconductor Read-Only Memory(ROM) device has advantages of small cell size and fully compatible standard CMOS logic process and therefore costs least price to manufacture compared to its counterpart memories like SRAM, DRAM or some Non-Volatile Memories, NVM including flash or EPROM memories. Usually, an ROM device has a matrix of ROM cells each is commonly composed of an N-type Metal Oxide Semiconductor (MOS) unit 1 with a fixed channel width and length as shown in FIG. 1a. Prior art of ROM cell design has limitation of 1 bit per cell with a sensing scheme composed of a reference voltage generation.

In contrast, the present invention provides a new design of ROM cell so that each ROM cell can store two or more bits of information. In a preferred embodiment illustrated below, each ROM cell has a channel width-to-length (W/L) ratio that corresponds to stored data of more than two bits of information. For example, a first ROM cell in an ROM device has a first channel W/L ratio and a second ROM cell in the ROM device has a second channel W/L ratio. Different channel W/L ratios cause different response current profiles so that the first ROM cell and the second ROM cell may have different stored values depending on their W/L ratios while a sensing mechanism is utilized for turning the response current profiles into data.

In addition, it can also be achieved to store more than two bits of information in a ROM cell by predetermining a threshold voltage of each ROM cell corresponding to the data to be stored in each ROM cell. An example for adjusting the threshold voltage of each ROM cell is to control the doping concentration of each ROM cell.

When the two techniques mentioned above are combined, further bits of information can be stored in each ROM cell of a ROM device. However, these two techniques can be applied separately. More detailed description for these techniques is disclosed below.

In a CMOS circuit, "Ground, or 0V" is mostly commonly used to represent a logic "0", while a "Supply voltage, VDD" is mostly commonly used to represent a logic "1." Data accessing of an ROM cell is done by applying an input voltage to a selected word line, WL, and another signal to a selected bit line, BL or a column. The word line selection is done by a word line decoder and a word line driver 7, as illustrated in FIG. 1c. A column decoder selects the output bit of a memory array. A sense amplifier 13 is commonly implemented to quickly convert the voltage difference between BL 9 and reference voltage 10 into a logic level of "0" or "1" with a shorter time delay of so named "sensing." In most memory circuit designs, during the non-accessing period, the bit line voltage will be pulled or so called "pre-charged" to the VDD level by a P-type device with the gate hooked up to a so called "Pre-charging" 8 signal. When the selected ROM cell is not programmed (or hooked) to the bit line, the bit line voltage will stay in the VDD or so named pre-charging level, if the selected ROM cell is connected to the bit line, then the ROM cell will pull the bit line voltage down. When the ROM cell pulls the bit line voltage down and lower than the reference voltage, the sense amplifier will switch the state.

Figure 2A:
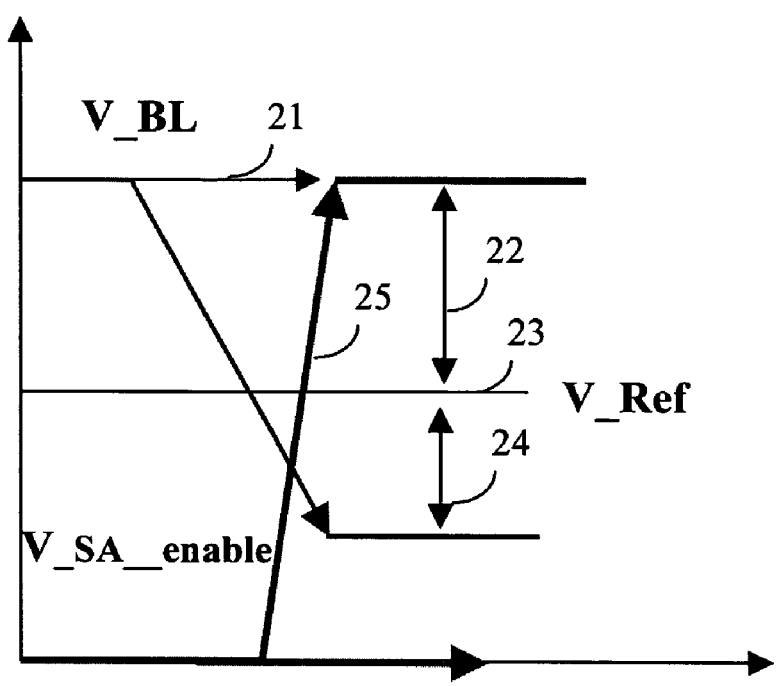
FIGS. 2A-2B depict timing of memory cell data accessing of a prior art sensing scheme. When the bit line voltage crosses the reference voltage, sense amplifier switches the state.
Figure 2B:
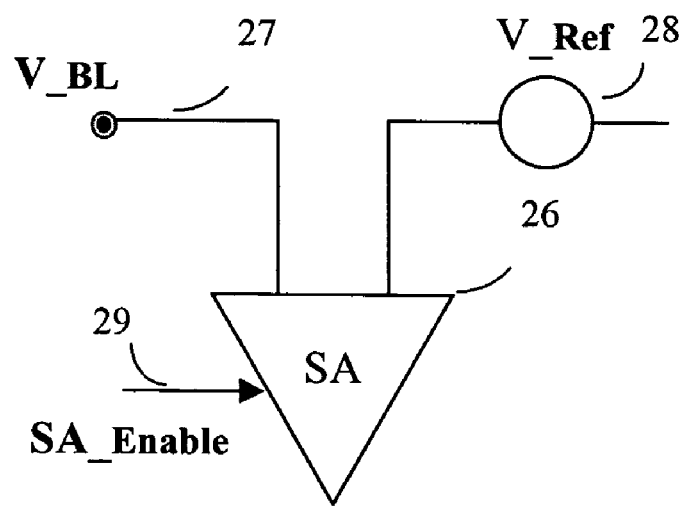

FIG. 2a depicts the most commonly used prior art sensing scheme of a memory accessing. In the prior art of ROM design, the bit line of an ROM array is pre-charged to VDD 21 as an shown in FIG. 2a with another reference voltage 23 predetermined and set in a level between VDD and Ground. For performance, the V_ref is set closer to the pre-charged level instead of GND level. The selected ROM cell of a "programmed" bit, if it is defined as all "connected" as a normal device sinks current and pulls the bit line voltage down from a pre-charged level. It takes a while for the selected programmed ROM cell to pull the bit line below the referencing voltage, the V_Ref. When the bit line voltage is crossing the V_Ref, the sense amplifier switches the state of output. If the selected bit of the ROM cell is an "un-programmed", the cell is not connected to either the bit line or GND, and cannot conduct the bit line to GND and will let the bit line voltage stay in the pre-charged voltage level which is above the reference voltage level, V_Ref 23 and the sense amplifier will not switch the output state. Leaving a reasonable voltage margin 22 between the V_Ref and the pre-charged level ensure the performance of sensing and the reliability. Another side of voltage margin 24 between the V_Ref. and the bit line voltage of a programmed cell till the sense amplifier turning on is to ensure the reliability and performance of reading a programmed ROM cell.

The sense amplifier 26 senses whether the bit line is above 22 or below 24 a predetermined voltage 23. The sense amplifier generates an output that is at one level of two voltage potentials. The first voltage potential corresponds with the voltage difference between the bit line and the bit line-bar being at a voltage level no less than a predetermined voltage. And the second voltage potential corresponds with the voltage difference between the bit line and the bit line-bar being at a voltage level less than a predetermined voltage. In a practical case, the output voltage of a sense amplifier swings from "Ground" to "Supply, VDD." FIG. 2a depicts the timing of the sense amplifier enabling. When a bit line voltage 27 and a reference voltage 28 are differentiated and reached a predetermined margin the sense amplifier is enabled 29 and the output state 25 of the sense amplifier will be determined.

Figure 3:
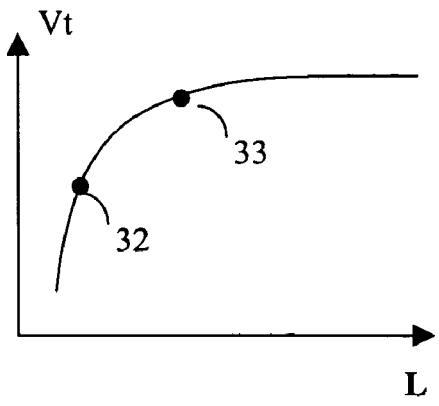
FIG. 3 describes the threshold voltage vs. channel length and width and the principle operation of the NMOS device.
Figure 3:
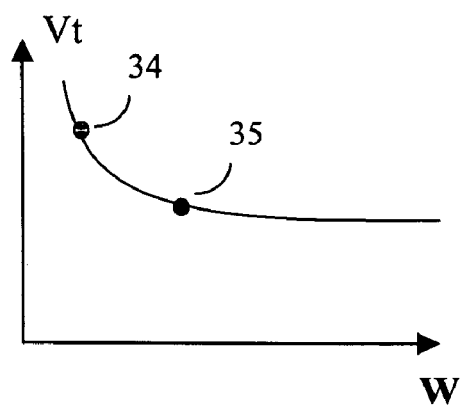
Figure 3:
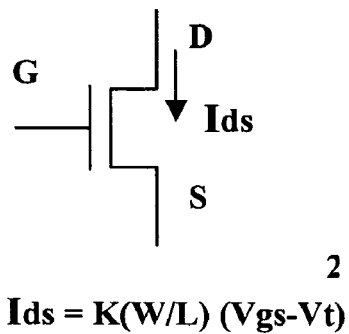
Figure 3:
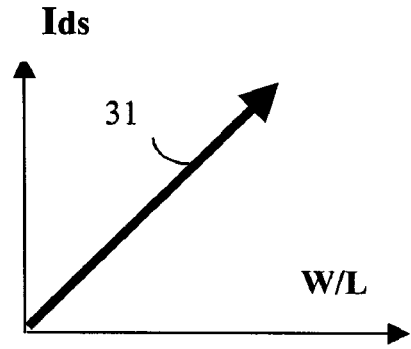
Figure 3:
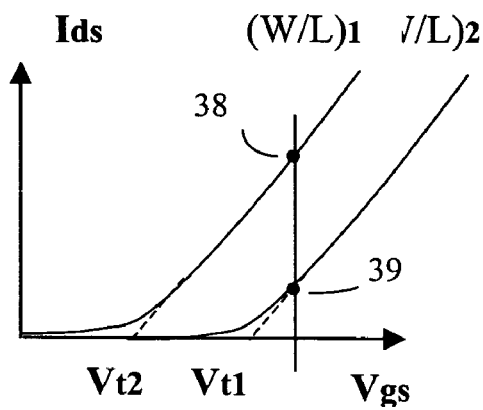
Figure 3:
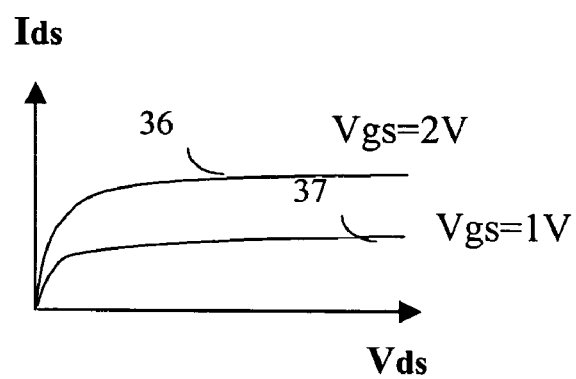

The threshold voltage of an MOS device can widely change within a certain range of device length of both channel length, L and width, W as shown in FIG. 3. The shorter the channel length 32, 33, the lower the threshold voltage can be. Contradictorily, the wider the width 34, 35, the lower can be the threshold voltage. The NMOS device which comprises the ROM cell can not start drawing current, Ids, or so called "Turn ON" until the gate-to-source, Vgs gets higher than the threshold voltage 38, 39. The gate-source voltage to drain-source current of an NMOS device is summarized in following form:

$$Ids = K(W/L)(Vgs - Vt)^2 \quad\quad (Eq. 1)$$

In the beginning of the ROM cell is turned on, the device enters the region so called "Linear" region in which region, the Ids increases linearly with the Vds. After it reaches so named "saturation" status 36, 37, the Ids will stay approximately constant no matter how higher the Vds increases. When the Vgs is fixed, the drain to source current will be approximately linearly proportional to the (W/L) 31.

Figure 4:
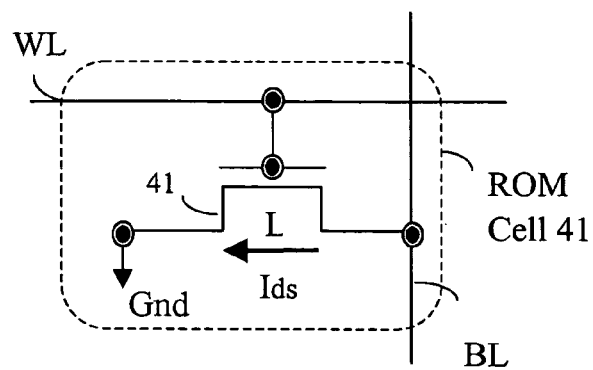
FIG. 4 depicts the present invention of the MLC ROM cell with potential multiple levels of channel width while fixing the channel length.
Figure 4:
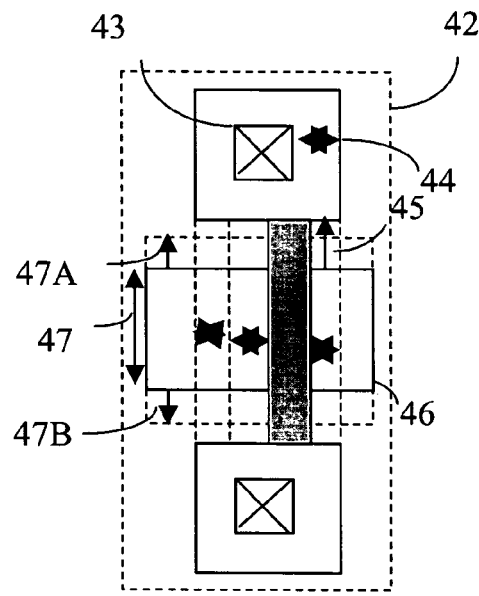
Figure 4:
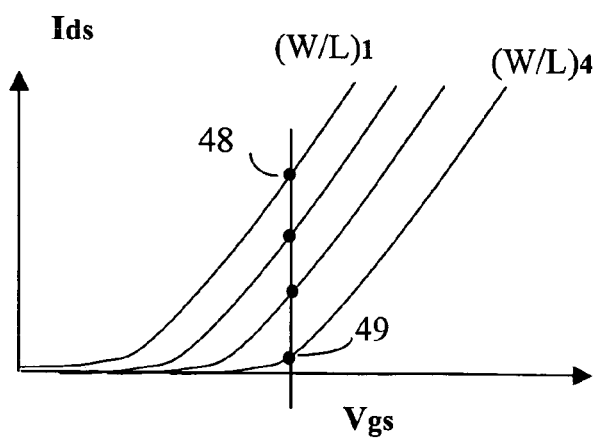
Figures 5A, 5B, 5C:
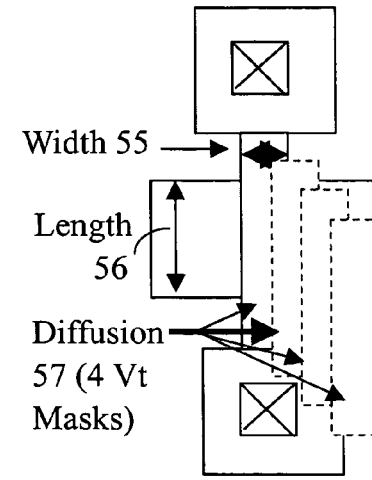
FIG. 5A depicts the differencing of bit line voltage and the output states with 2 bits per cell using 4 channel widths.
FIG. 5B depicts the differencing of bit line voltage and the output states with 2 bits per cell using 4 threshold levels.
FIG. 5C depicts the differencing of bit line voltage and the output states with 4 bits per cell with 4 channel widths and 4 threshold voltages.
Figure 6:
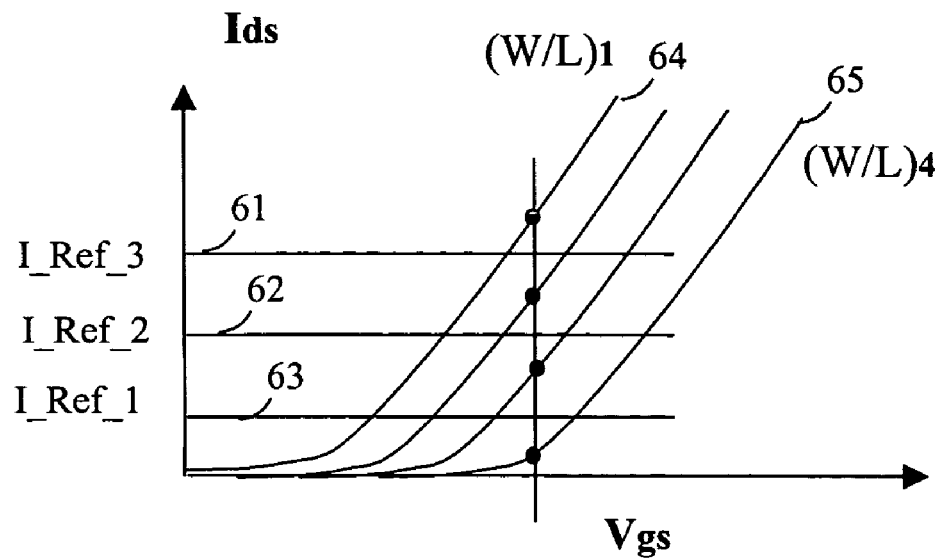
FIG. 6 illustrates the characteristic of the current sinking speed of the MLC ROM cells and the reference cells.

FIG. 4 depicts the ROM cell 41 and the corresponding physical layout 42 of the cell. A contact 43 connects the diffusion of drain node to the bit line, while another side, a contact connect of source node of diffusion to the ground. For avoiding current leak of device, there is a minimum spacing between the edge of contact to the edge of diffusion 44 and the edge of diffusion to the edge of the poly 45. Since there is a requirement of minimum spacing between edges of diffusion to contact and to poly, there is wasted area of a prior art ROM cell. In the embodiment according to the present invention, the same size of area or at most a little increase of area of each cell is used to implement 4 possibility of (W/L) as shown in FIG. 4. In the example of an ROM cell, with a fixed channel length 47, space between the edge of the diffusion can be easily divided into 4 possibility of channel widths 46 with a minimum of one unit of width which has minimum but reasonable good sinking strength 49. The wider the channel width, the higher current amount it can draw, the maximum current the ROM cell can draw is the one with highest (W/L) 48. With 4 possibility of (W/L), the ROM cell can draws 4 possible levels of Ids which can be easily converted into 2 logic bits for one cell. The 4 possible (W/L) of a ROM cell draws 4 possible Ids which can pull the pre-charged bit line voltage by 4 possible speeds. Three reference voltages can be designed to indicate the states of VBL 51 and the 2 corresponding logic states 53.

Another embodiment of the present invention of the multi layer cell ROM, with a fixed channel length 56 and width 57, is the 3 additional masks 57 of diffusion which are applied to implant 3 more possibility of N+ ion doping which correspondingly makes 3 additional possibility of Vt levels 54. A total of 4 possibility of Vt levels 54 are achieved to make a cell represent 2 bits of logic states.

To achieve even higher density or said bits per cell under a reasonable die cost of area, a combination of multiple Vt and multiple (W/L) are applied to optimize the cots of die area and masks. In another embodiment of the present invention of the multi layer cell ROM, an ROM with 4 possible channel widths and 4 possible Vt are designed to make 16 possible Ids 58 and accordingly to achieve 4 logic state per cell 59.

Figure 7:
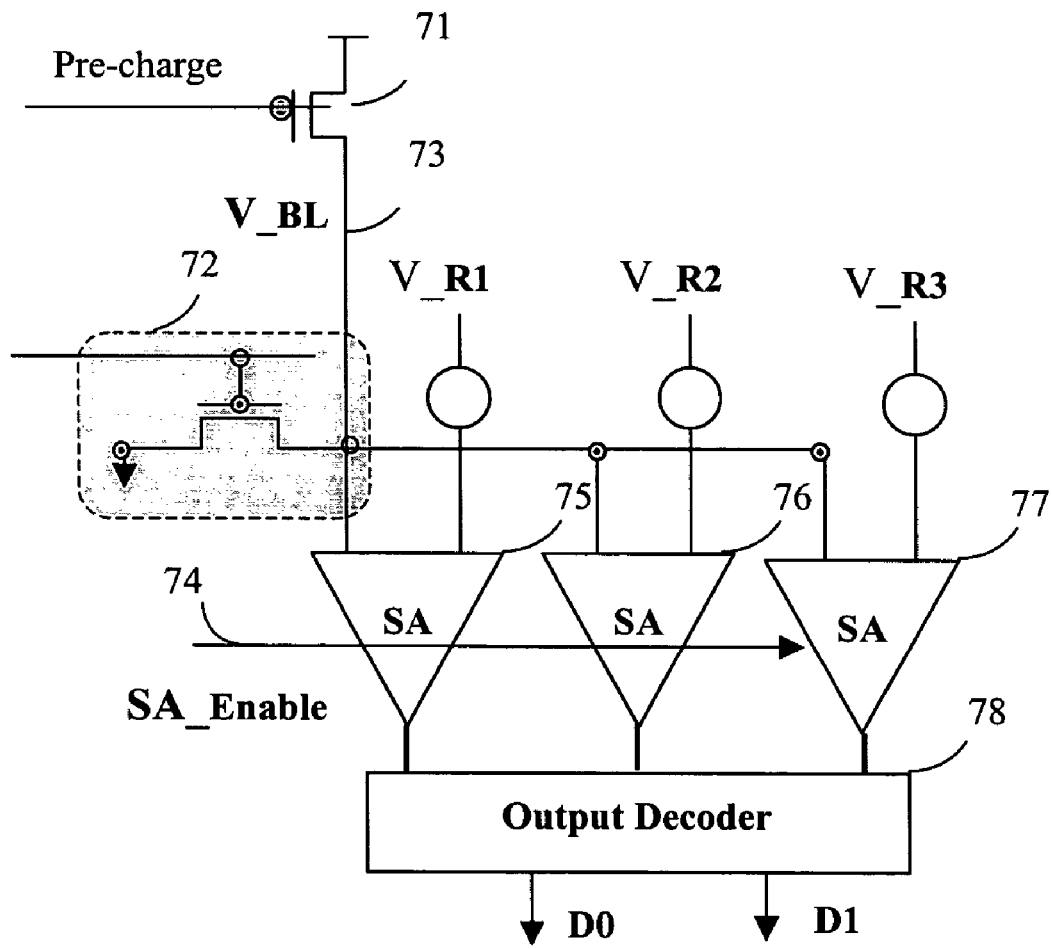
FIG. 7 depicts a simplified sensing scheme of the MLC ROM array with 3 sense amplifiers for a 2 bits output per cell.

The sensing scheme plays an important role in converting the memory cell information into final logic state. The main task goals of a sensing scheme are most likely: performance, reliability or said accuracy and for some degree of low power consumption. In the prior art of 1 bit per cell ROM, the sensing scheme has many options of designs. A conventional analog differential amplifier or a latch like dynamic amplifier all function well. In the present invention of the multi layer cell ROM, under the goal of 2 bits per cell, there are need of 3 levels of reference voltages 61, 62, 63 to identify the 4 possible levels of bit line voltage which are generated by 4 possible degrees of different (W/L). FIG. 7 illustrates the simplified sensing scheme of the 2 bits per cell ROM. Bit lines 73 of a memory array are pulled to a predetermined level through a P-type device 71 when the memory array is not in accessing state. The bit line of the selected ROM cell 72 will be connected to the inputs of 3 sense amplifiers 75, 76, 77 while the other node of input to a sense amplifier is connect to the reference voltage, V_R1, V_R2 and V_R3. A logic decoder 78 is to map the 4 output states to indicate 2 logic states.

Figure 8:
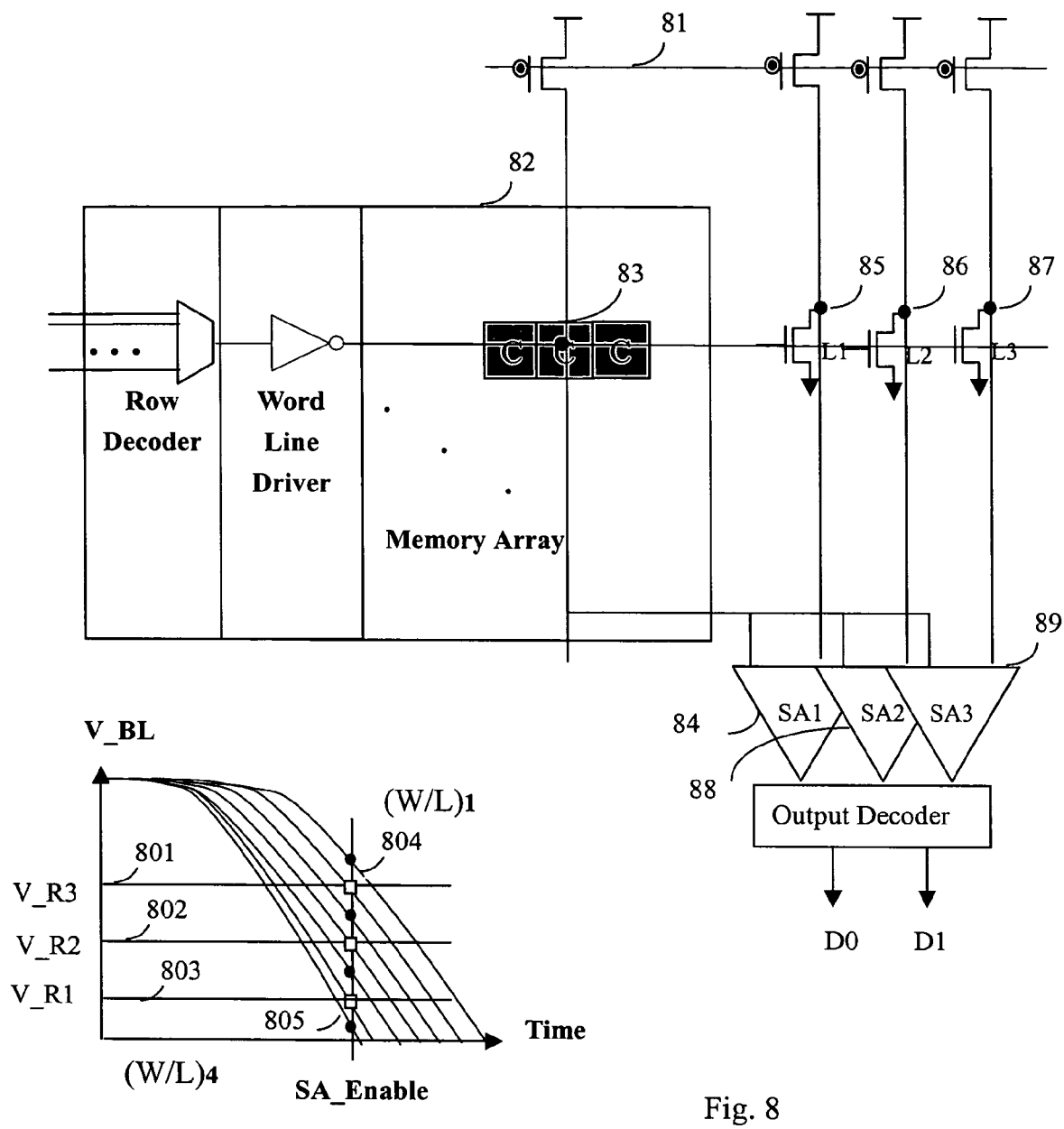
FIG. 8 depicts a simplified sensing scheme of the present invention of MLC ROM array with 2 bits per cell and its corresponding characteristics of bit line voltage.
Figure 9:
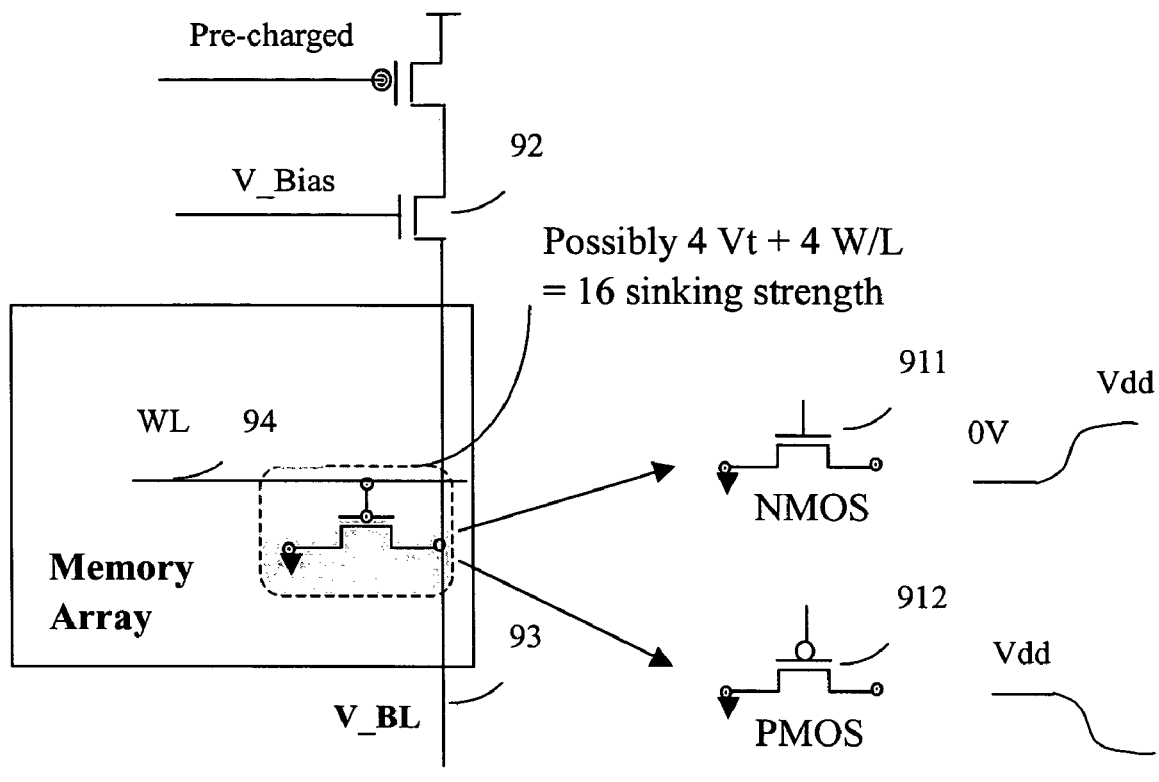
FIG. 9A depicts the present invention of the MLC ROM cell with potential of 4-bit per cell of 4 Vt+4 (W/L)s including using both PMOS and NMOS devices.
FIG. 9B depicts the present invention of the MLC ROM cell with potential budgeted ROM cell current margin between each level.
Figure 9:
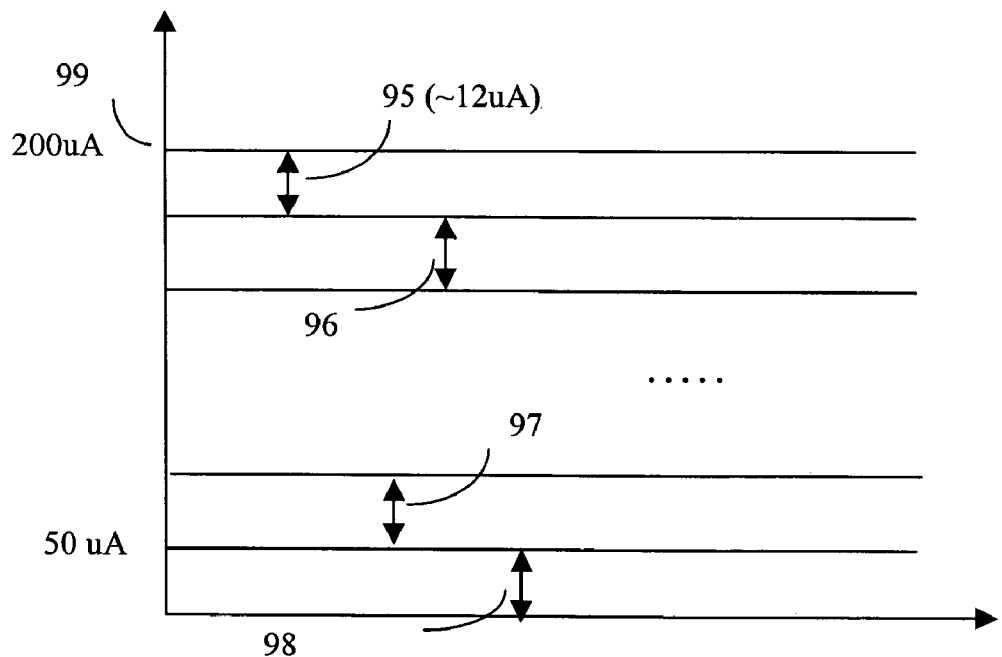

In the design of high density of semiconductor memory, for avoiding the error of data sensing caused by the device deviation and power supply or ground voltage bouncing can easily cause error of sensing, circuits of tracking the process deviation and supply voltage bouncing as shown in FIG. 8 are proposed in the present invention of the MLC ROM. Three reference columns of ROM cells along with pre-charging devices 81 are used to generate the previously described 3 reference voltages 85,86,87 by pulling the bit lines down at different speed. During accessing period, when a word line is turned on and an ROM cell 83 is selected, the same word line turns on 3 reference cells in the reference columns. The 3 (W/L) levels of those ROM cells of the reference columns are made between predetermined levels of (W/L)1, (W/L)2, (W/L)3 and (W/L)4. Each reference column has the same size of referencing ROM cells. The 3 bit line voltage 801, 802, 803 of the reference columns are connected to the inputs of the 3 sense amplifiers to be compared to the bit line voltage 83 of the memory array 82. In the design of 2 bits per cell, there are 4 possible level of sinking speed and also 4 bit line voltage dropping speeds 804, 805. Both selected cell of the memory array or reference columns start sinking current and pulling down the bit line voltages. Three dynamic sense amplifiers are used to identify the out state of 4 logic states which generate 2 bits per cell output logic states.

The degree of difficulty shoots up in the design of 4 bits per cell ROM. The sensing scheme of bit line voltage differencing has much narrow sensing margin and hence the design of the sensing scheme of this MLC ROM of the 4 bits per cell is different from the one described above for the 2 bits per cell ROM. Unlike depending on the bit line voltage pulling speed, the I_ds through the ROM cell is precisely designed by 4 (W/L) and 4 (Vt) implant doping. A bias voltage 92 is applied to generate a stable output voltage and to supply current during sensing. The ROM cell can be implemented by an NMOS device 911 with the word line voltage going high to turn ON. The ROM cell can also be implemented by a PMOS device 912 with the word line being grounded to turn ON. In the density higher than 3 bits per cell, the margin of current sinking through the ROM cell becomes narrow if the ROM is implemented by an NMOS device since the (Vgs-Vt) is the limit of the current. So, it is preferable that the ROM cell is implemented by a PMOS device which has more flexibility and margin of deeper negative voltage levels as the threshold voltages. The ROM cell has 16 possibility of current sinking strength 95, 96, 97, 98 with the margin of 12 uA and a minimum current of 50 uA and the highest current 99 is around 200 uA.

For pursuing higher area efficiency, one of the embodiment of the present invention of the MLC ROM is to implement the ROM cells by using one kind of so named "flat cell" which is a popular cell in the design of the mask ROM. A "flat cell" is "contact-less" with all nodes, gate drain and source connected to the word line, bit line and ground correspondingly and applies two levels of threshold voltages to identify a logic "0" or a logic "1." The difference between this invention and the prior art Mask ROM is the present invention has more than one ration of (W/L) with a little increase of flat cell size. For even higher density said 4 bits per cell, the present invention when using a flat cell ROM, more than 2 levels of threshold voltages are applied to combine with multiple ratios of (W/L) to achieve potential multiple levels of current flow through the device channel. The flat cell of the ROM can be implemented by an N-type device as well as a P-type device.

Figure 10:
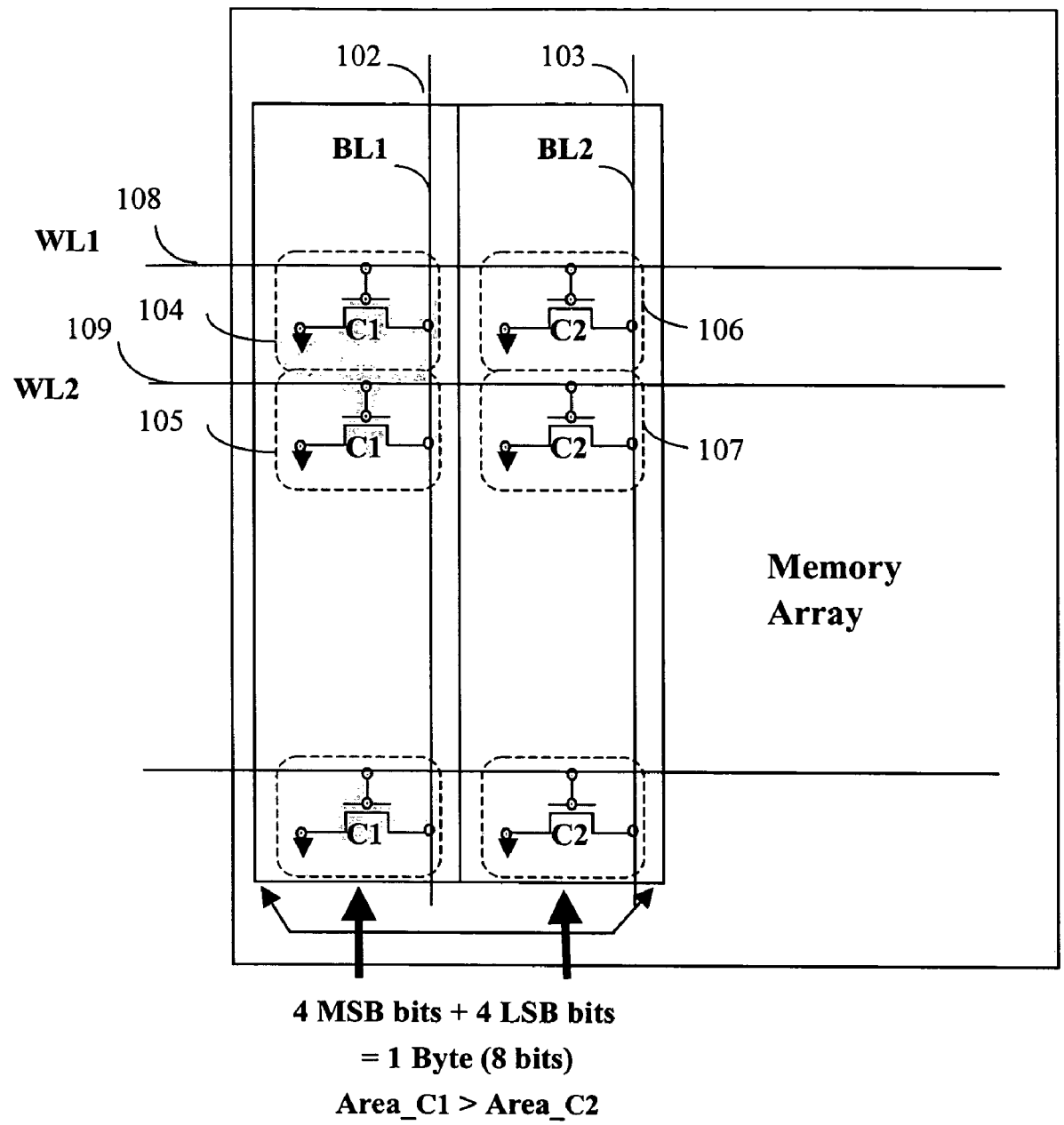
FIG. 10 illustrates a memory array with 2 types of MLC ROM cells, one for MSB bits with larger cell size of higher reliability, the other for LSB bits with smaller cell size of less reliability.

In pursuing higher density, the reliability becomes a critical issue. In multimedia applications, the MSB bits are more critical than the LSB bits. One of the embodiments of the present invention of the MLC ROM of 4 bits per cell density is shown in FIG. 10, the ROM cells storing 4 MSB bits per cell is more critical than the one storing the LSB bits. Larger cell size of ROM cells 104, 105 are determined for storing the MSB bits and smaller size of ROM cells 106,107 are determined for storing the MSB bits. When a word line 108 is turned on, the selected bit lines which might comprise of 2 bit lines 102,103 with 4 bits output each cell.

As mentioned above the memory cell for 4 bits density might have differential margin of 3 uA. The prior art of sensing scheme of FIG. 1 will not function well since the voltage margin between each level is too narrow. The prior art scheme pre-charges the bit line to a predetermined level, said VDD and shut off the pre-charging device during the accessing cycle and let the ROM cell to sink current and to pull the bit line voltage down.

Figure 11:
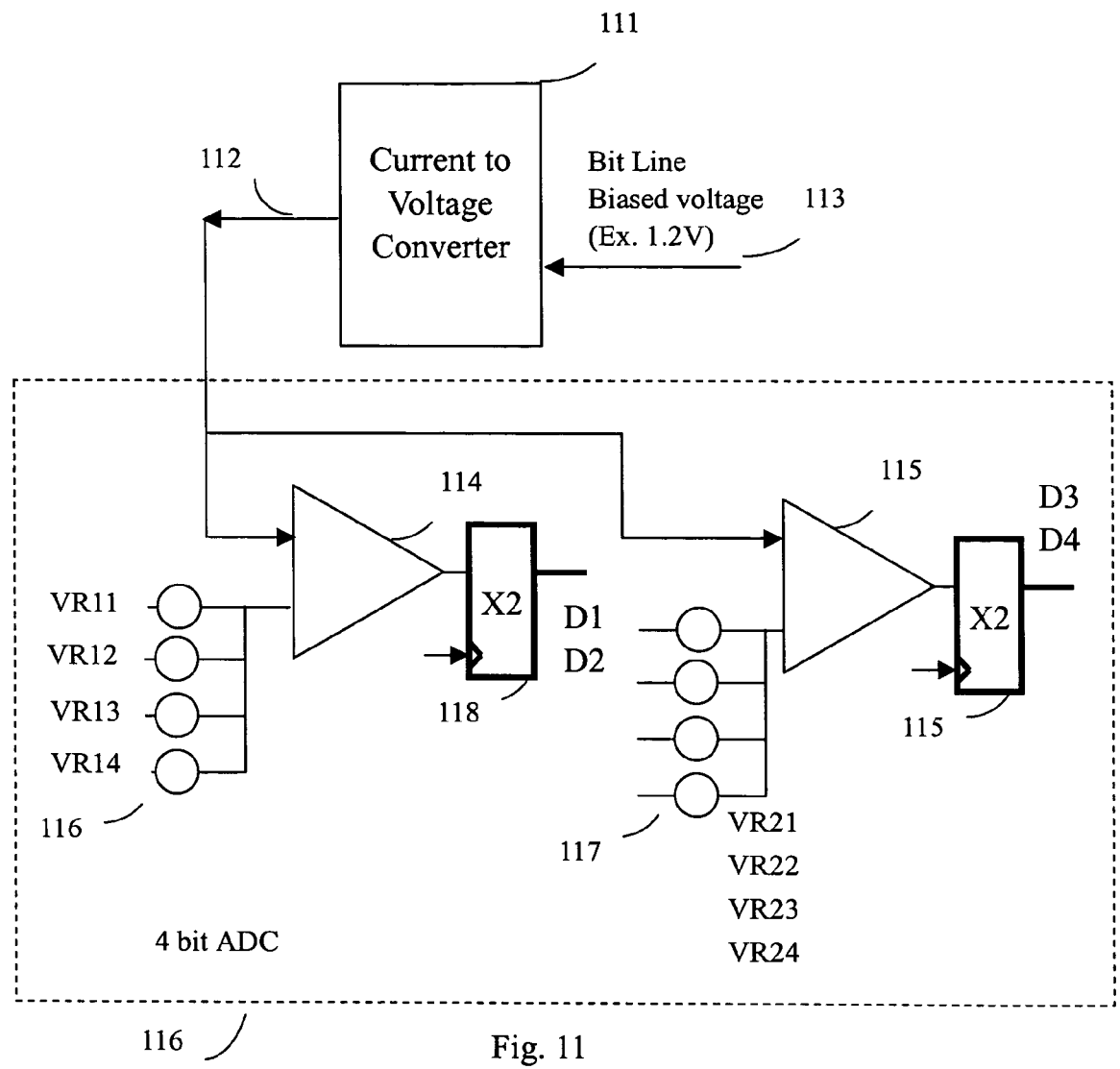
FIG. 11 depicts the sensing scheme with a current-to-voltage converter, a 4 bits ADC with 2 steps of sensing for the 4 bits per cell ROM.

One of the embodiments of the present invention of the MLC ROM of multiple bits per cell applies a new and operable sensing scheme with firstly converting the current to voltage as show in FIG. 11. As described in Eq. 1, the current flowing through the channel of an ROM cell is constant once the (W/L), Vt and the Vgs (most likely the VDD level) are predetermined $$Ids = K(W/L)(Vgs - Vt)^2$$

With the reference voltage 113 as an input, a current to voltage converter 111 transforms the constant current through the ROM cell into a constant voltage level 112. Two comparators 114, 115 are the main component of the 4 bits ADC, analog-to-digital converter 116 implemented to convert the output voltage 112 of the current-to-voltage converter into two bits of output D1, D2, D3, D4 and latched into an output register 118, 115 separately. The $1^{st}$ comparator 114 sense the 2 LSB bits of the output voltage of the current-to-voltage converter, while the $2^{nd}$ comparator is to sense the 2 MSB bits. The 4 referencing voltages of each comparator are connected to the input of the comparator to be compared to the output of the current-to-voltage converter.

It will be apparent to those skilled in the art that various modifications and variations can be made to the structure of the present invention without departing from the scope or the spirit of the invention. In the view of the foregoing, it is intended that the present invention cover modifications and variations of this invention provided they fall within the scope of the following claims and their equivalents.

What is claimed is:

1. A semiconductor ROM device, comprising:
   an array of ROM cells, each cell being an N-type MOS unit and occupies the same space of a semiconductor die area;
   each N-type MOS cell within the ROM array having the same channel length which is made of a diffusion drain node directly connected to a bit line node and another diffusion source node directly connected to ground or another node of a power supplier;
   a plurality of channel width candidate values for predetermining a response voltage profile of pulling down the bit line voltage; and
   a sensing circuitry for generating a plurality of bits by decoding the response voltage profile received from one of the referencing MOS unit and the corresponding bit line.

2. The semiconductor ROM device of claim 1, wherein when applying a voltage on a gate terminal of the MOS unit when applying a voltage onto a gate terminal of the MOS units, with a level of higher than the threshold voltage, the corresponding ROM cells start pulling down the voltage of the bit lines which connect to the selected ROM cells.

3. The semiconductor ROM device of claim 1, wherein a doping concentration of the channel of each MOS cell is separately predetermined from a plurality of doping concentration candidate values for predetermining a threshold voltage of each MOS unit, and each doping concentration candidate value corresponds to one different threshold voltage that further determines the response slope of pulling down the corresponding bit line voltage.

4. The semiconductor ROM device of claim 1, wherein the MOS units are N-type devices, and the drain terminal of each MOS unit is directly connected to a bit line if programmed or floating if not programmed, the gate terminal of each MOS unit is connected to a word line if programmed or floating if not programmed, and the source terminal is directly connected to "Ground" if programmed or floating if not programmed.

5. A semiconductor ROM device, comprising:
   a plurality cells forming an ROM array, wherein each cell is a P-type MOS unit, and the drain terminal of each MOS unit is directly connected to a bit line if programmed or floating if not programmed, the gate terminal of each MOS unit is connected to a word line if programmed or floating if not programmed, and the source terminal is directly connected to "Ground" if programmed or floating if not programmed.

* * * * *